United States Patent

Culling

[11] Patent Number: 5,532,648
[45] Date of Patent: Jul. 2, 1996

[54] RADIO FREQUENCY AMPLIFIERS WITH COMPENSATION SIGNAL TO ACCOMMODATE CHANGES IN THE CONDUCTION POINT DUE TO TEMPERATURE CHANGES

[75] Inventor: Dennis A. Culling, Cambridge, Great Britain

[73] Assignee: Harris Corporation, Melbourne, Fla.

[21] Appl. No.: 256,221

[22] PCT Filed: Dec. 29, 1992

[86] PCT No.: PCT/GB92/02402

§ 371 Date: Jun. 22, 1994

§ 102(e) Date: Jun. 22, 1994

[87] PCT Pub. No.: WO93/13594

PCT Pub. Date: Jul. 8, 1993

[30] Foreign Application Priority Data

Dec. 30, 1991 [GB] United Kingdom ............... 9127469
Feb. 4, 1992 [GB] United Kingdom ............... 9202302

[51] Int. Cl.⁶ .................................................. H03F 1/30
[52] U.S. Cl. ............................................ 330/289; 330/290
[58] Field of Search ........................... 330/289, 290, 330/296, 285, 129, 136; 348/707

[56] References Cited

U.S. PATENT DOCUMENTS 3,497,822  2/1970  Beurrier ........................... 330/30
4,547,746  10/1988  Erickson et al. .................. 330/129 X
4,849,712  7/1989  Jarrett ............................. 330/289 X
4,924,194  5/1990  Opas et al. ....................... 330/289
5,311,143  5/1994  Soliday ........................... 330/136 X
5,345,192  9/1994  Green ............................. 330/289

FOREIGN PATENT DOCUMENTS 3335170  4/1985  Germany.

OTHER PUBLICATIONS

8th European Microwave Conference 78, Sep. 4 through 8, 1978, Sep. 4, 1978, Paris FR, pp. 135–139.

J. A. Vaughan et al. "Bipolar and F.E.T. Power Amplifier For A 2,6 GHZ Community Television Transponder".

Primary Examiner—Steven J. Mottola
Attorney, Agent, or Firm—Tarolli, Sundheim, Covell, Tummino & Szabo

[57] ABSTRACT

A radio-frequency amplifier incorporating at least one amplifing device comprises means for applying to the device a signal related to changes in the radio frequency power handled by the device, thereby to compensate for changes in the conduction point of the device due to temperature changes within the structure of the device resulting from changes in the radio frequency power handled by the device.

8 Claims, 4 Drawing Sheets

RADIO FREQUENCY AMPLIFIERS WITH COMPENSATION SIGNAL TO ACCOMMODATE CHANGES IN THE CONDUCTION POINT DUE TO TEMPERATURE CHANGES

FIELD OF INVENTION

The present invention relates to radio frequency amplifiers and more particularly, but not exclusively, to radio frequency amplifiers for use in television transmitting apparatus.

BACKGROUND TO THE INVENTION

The devices used in such amplifiers, which may be semiconductor devices such as transistors, or therminoic tubes, may be required to handle large radio frequency (RF) currents which may fluctuate, for example with the degree of modulation of the RF signal being amplified.

It is an unfortuante feature of such devices that their internal temperature will vary as a function of the average RF power handled, due to the heating effect of the RF current. The resulting changes of internal temperature produce corresponding changes in the condustion point of the device and therefore related changes of gain.

For example, in a silicon transistor, the base-emitter voltage necessary to initiate collector current flow, Vbe, changes by 2.1 mV for each degree centigrade change in the temperature of the silicon structure of the device.

Radio frequency amplifiers in television transmitters are commonly run in Class AB mode, in which a degree of non-linearity in the power-in/power-out characteristic of the amplifier is tolerated at high signal levels. However to achieve optimum performance from such Class AB amplifiers, the biassing level of the amplifying device is critical. It will be appreciated that variation in the conduction point of the device, resulting from internal temperature changes caused by radio frequency Dower level variation can give rise to unwanted and varying distortion of the output signal from the device, as the average radio frequency power level varies.

In a radio frequency amplifier within television transmitting apparatus the problem is particularly severe as the amplitude of the modulated radio frequency signal and hence the average radio frequency power handled by the device can undergo rapid swings as the signal varies from levels corresponding to white (minimum power) to black (maximum power). The effect of resulting non-linearities on the transmitted vision signal due to thermal changes within the device can be most noticeable.

The thermal changes associated with the internal heating of the device are rapid, and occur in the internal structure of the device. It is therefore not possible to monitor and correct for such changes by means such as an externally attached temperature sensor forming part of a compensation arrangement, such as may be used with radio frequency power amplifying devices to correct for relatively long-term thermal changes due to ambient operating conditions.

It is thus an object of the present invention to obviate at least in part the deleterious effect of such rapid internal temperature changes due to variations in radio frequency power level, on the performance of devices employed in radio frequency amplifiers.

SUMMARY OF THE INVENTION

According to one aspect of the invention, a radio-frequency amplifier incorporating at least one amplifing device comprises means for applying to the device a signal related to changes in the radio frequency power handled by the device, thereby to compensate for changes in the conduction point of the device due to temperature changes within the structure of the device resulting from changes in the radio frequency power handled by the device.

The compensation signal related to the changes in the radio frequency power handled by the device may be derived from a sensing element in the circuit of the device.

The sensing element may be connected in the principal current path of the device, and may be a resistor.

Alternatively the compensation signal may be derived from elsewhere in a signal chain of which the amplifier forms part, either from a point in the signal chain prior to the amplifier, or from a point in the signal chain following the amplifier.

The compensation signal may be applied to a biassing circuit of the device, preferably by means of a signal filter the time constant of which is related to the internal thermal time constant of the device associated with changes of power level therein.

The time constant of the signal filter is preferably substantially the same as the internal thermal time constant of the device.

The compensation signal may also be applied to a further device or devices in the same signal chain having substantially the same internal thermal time constant as the first mentioned device.

The invention also lies in signal transmitting apparatus when provided with a radio frequency amplifier embodying the invention, typically a television signal transmitting apparatus.

Embodiments of the invention will now be described solely by way of example with reference to the accompanying drawings in which.

DETAILED DESCRIPTION OF THE DRAWINGS

Figure 1:
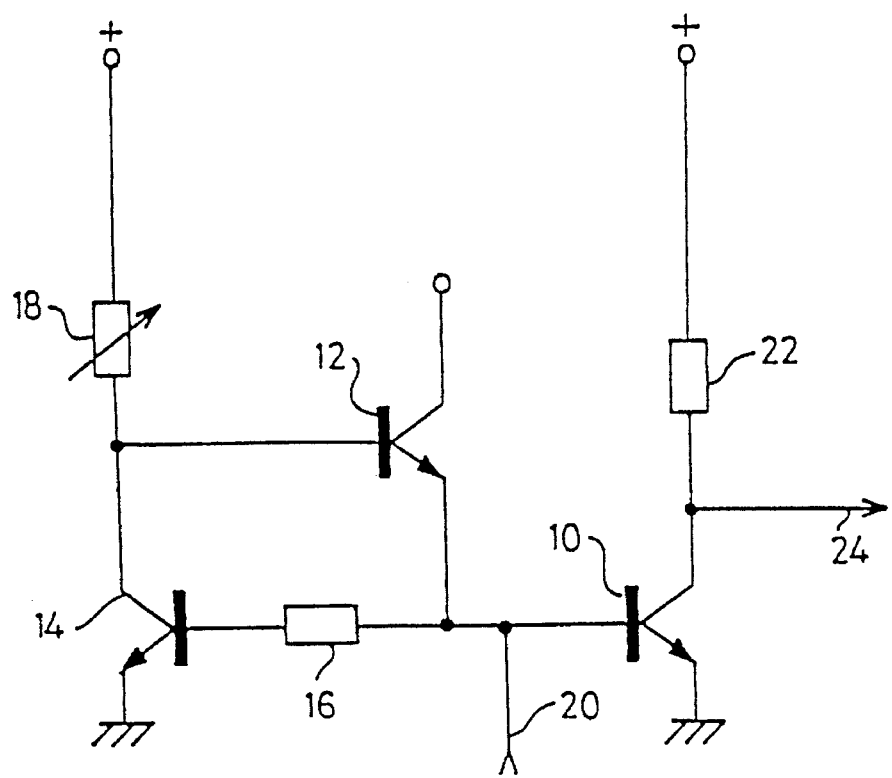
FIG. 1 is an outline circuit diagram of an RF amplifier in accordance with the prior art.

Referring to FIG. 1, an RF amplifier comprises an amplifying device, transistor 10, provided with a conventional biassing circuit comprising transistors 12 and 14 and resistors 16 and 18.

An RF signal applied to the base of transistor 10 via lead 20 is amplified by the device and an amplified output derived via lead 24 from a load 22 in the collector circuit of the device.

Figure 2:
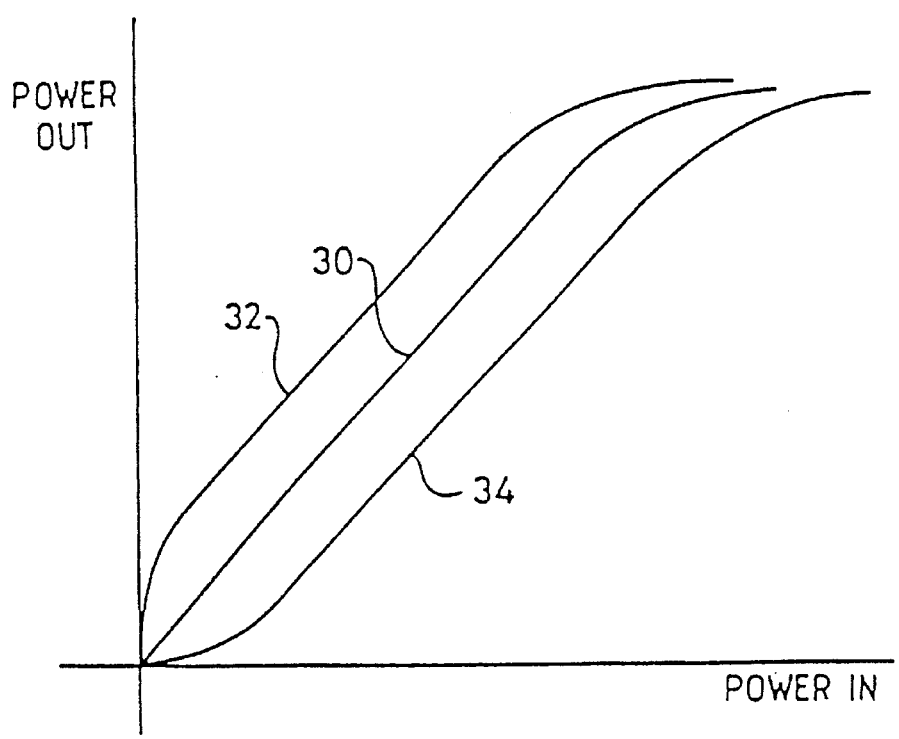
FIG. 2 illustrates the power transfer characteristics of the amplifier of FIG. 1 with differing biassing conditions.

The quiescent operating condition of the amplifier is adjusted by means of resistor 18 to provide a bias upon its base to give the amplifier a transfer characteristic such as is illustrated at 30 in FIG. 2, which provides a linear response at low and medium power inputs but with an increasing but tolerable degree of distortion at higher power inputs. This type of operation is typical of Class AB operation.

The effect of a change of conduction point of the device is shown by reference to characteristics 32 and 34 of FIG. 2. If the quiescent current in the collector circuit of the device is too high, the transfer characteristic 32 results, with a non-linearity producing excessive gain at low power input levels. If the quiescent current is too low, the transfer characteristic 34 results with a non-linearity producing low gain at low power input levels.

In an RF carrier modulated with a TV video signal, low power levels equate to white signal and high power to black signal and sync pulses, with colour-related components of the signal at intermediate power levels. The importance of maintaining linearity (Class A operation) at low and medium power levels will thus be apparent, as will the ability to tolerate a limited degree of distortion (Class B operation) at high power levels, corresponding to black and sync pulse levels.

In an amplifier such as illustrated in FIG. 1, operation of the device 10 with an applied radio frequency signal produces internal heating of the device as a function of the RF power level handled. The heating occurs at the silicon surface of the device and produces a change in Vbe, the base-emitter voltage of the transistor at which conduction commences, which causes movement of the transfer characteristic of the amplifier from the ideal, giving rise to non-linearities at lower power levels and thus unacceptable distortion of a video-modulated RF signal.

Figure 3:
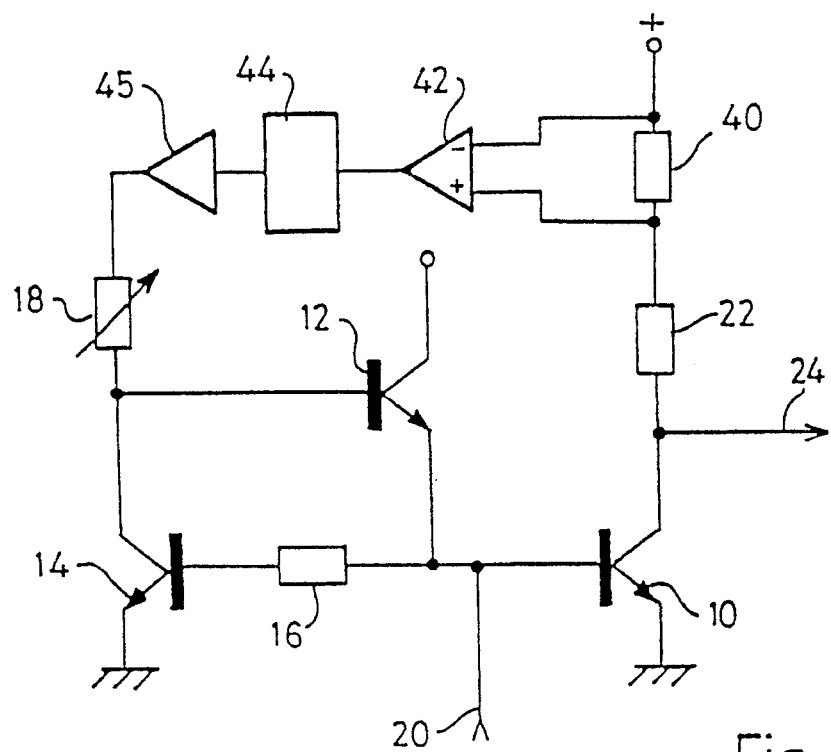
FIG. 3 is an outline diagram of the RF amplifier of FIG. 1 modified in accordance with and illustrating the principles of operation of the invention.

In the RF amplifier in accordance with the invention shown in FIG. 3, the amplifier of FIG. 1 is modified by the provision of a feedback circuit comprising current-sensing resistor 40 in the collector circuit of transistor 10, inverting amplifier 42, low-pass filter 44 and non-inverting buffer amplifier 45.

In operation, a voltage directly related to the modulation level of the RF current in the collector-emitter path of transistor 10, and hence to the RF power level in the device, is developed across resistor 40. As the collector current increases or decreases with changes of RF power level in transistor 10, so the voltage across resistor 40 increases or decreases. This voltage is inverted by the inverting amplifier 42 and fed to the biassing circuit of transistor 10 thereby changing the biassing level upon transistor 10 to compensate for changes in Vbe due to RF power-related internal heating in transistor 10.

The filter 44 determines the rate at which the bias upon the base of transistor 10, is changed by the compensation signal derived from RF power level changes in that device. The rate will be a function of the internal thermal characteristic of transistor 10, and will preferably be the same or substantially the same as the internal thermal characteristic of the transistor. Because the internal thermal characteristics of a device are not generally made known by device manufactures, and as different devices will have substantially different internal thermal characterisitcs, the desired rate of change of bias due to the compensating signal has to be determined and set empirically, for example by running the device with a succession of differing power levels within the expected dynamic operating range of transistor 10 and adjusting critical component values in filter 44 in a known manner to provide a compensating bias to the base circuit transistor 10 to maintain the bias level substantially constant.

Figure 4:
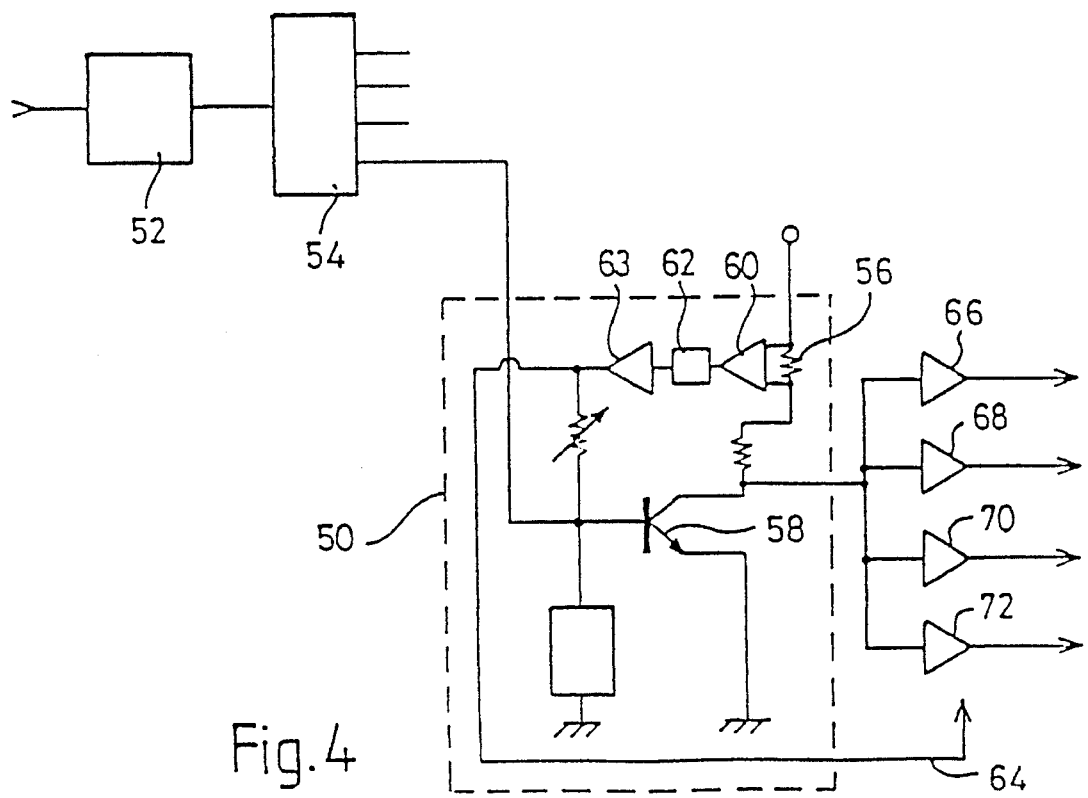
FIG. 4 is a block diagram of the final stages of a television transmitter employing an RF amplifier in accordance with the invention.

The amplifier described in FIG. 3 may be employed as a driver amplifier in the final stages of a TV transmitter, the function of the amplifier being to provide the final drive to a series of parallel RF output stages. Such an arrangement is illustrated in outline in FIG. 4.

RF driver amplifier 50, fed with a modulated RF signal from modulator 52 via splitter 54, incorporates a feedback bias compensation arrangement in accordance with the invention, sensing resistor 56 in the collector circuit of transistor 58 developing a voltage related to the collector current, and hence the RF power level in transistor 58, which is fed back via amplifier 60 and low pass filter 62 to the biassing circuit of transistor 58 to compensate for internal temperature changes in transistor 58 due to RF power level changes. At the same time the compensating bias from the feedback circuit of transistor 58 is fed via lead 64 to the biassing networks of RF amplifying transistors of the same type as transistor 58, in the parallel output amplifier stages 66, 68, 70 and 72, to provide similar compensation.

Figure 5A:
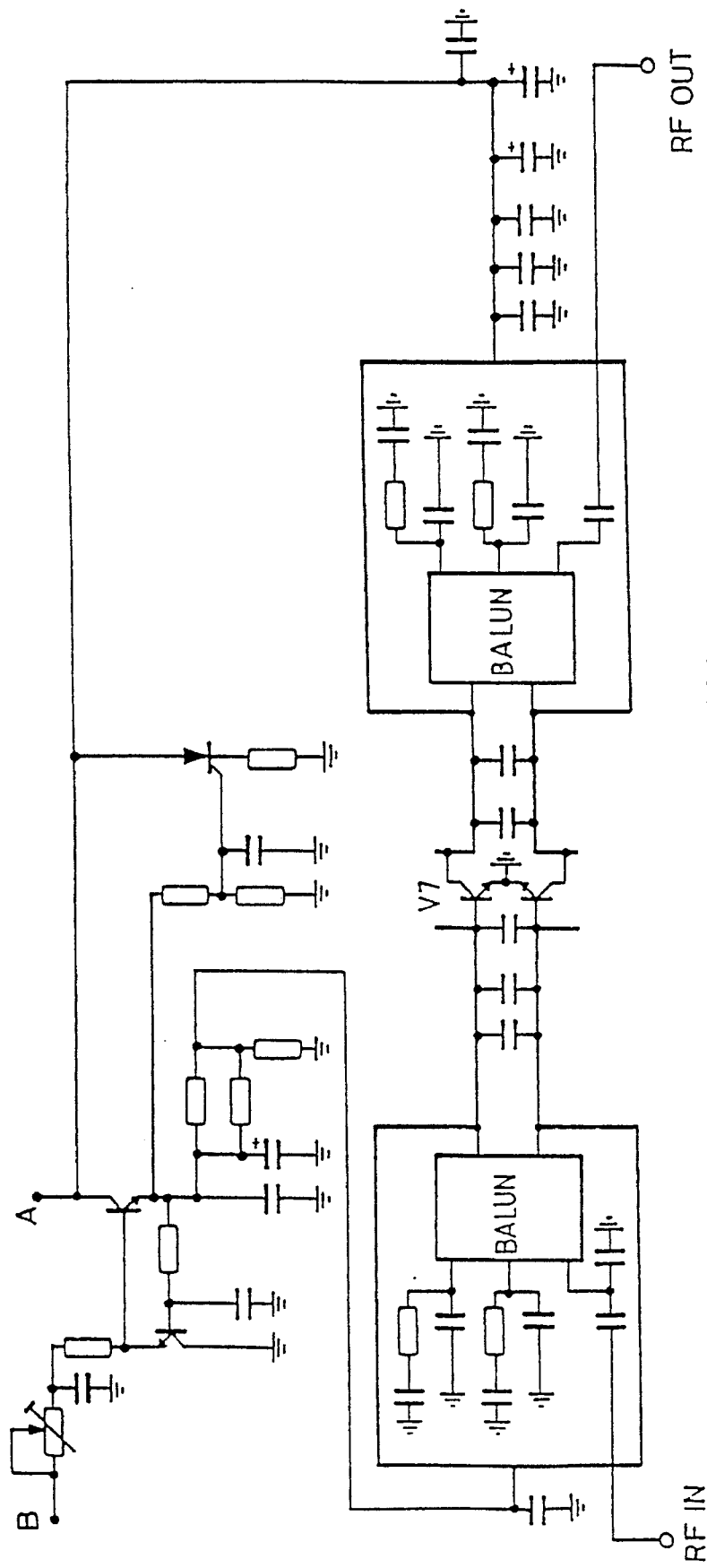
FIGS. 5(a) and 5(b) are the essential parts of the circuit diagram of an RF amplifier in accordance with the invention, employed in a television transmitter.
Figure 5B:
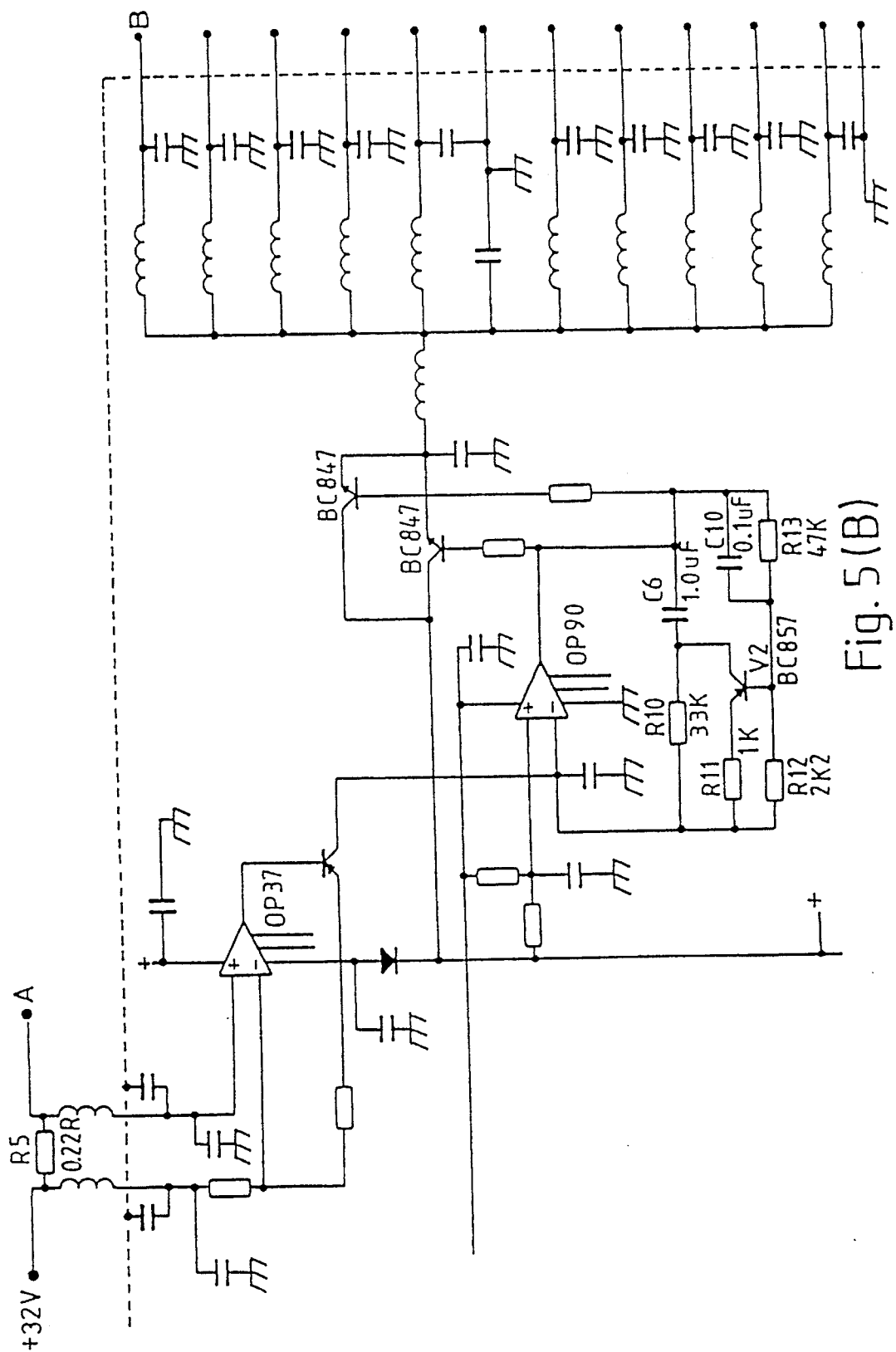

Referring to FIG. 5, FIG. 5A shows a 150 watt RF driver amplifier of a television transmitter and FIG. 5B the compensation signal deriving circuit for the driver amplifier of FIG. 5A and other amplifiers, all in accordance with the invention.

Resistor R5, of FIG. 5B, connected via terminals A, in the collector circuit of RF driver amplifier transistor V7 of FIG. 5A, (Motorola Type XPS 1028), acts as the sensor resistor in the internal thermal change compensation arrangement for transistor V7, and the voltage derived across it, varying with the video modulation level and hence the power level handled by the RF driver transistor V7, applied, after the removal of any RF component, to the inverting amplifier OP37. The inverted and varying DC level from inverting amplifier OP37 is fed to the low pass filter based upon amplifier OP90 which comprises components R10, C6, R11, R12, R13 and C10 whose values, marked upon the circuit diagram, are selected to give a rate of change of bias compensation to transistor V7, related to the internal thermal characteristic of that transistor.

In the circuit shown in FIG. 5B, the rate determining components of the low pass filter have the values indicated, to provide the appropriate rate of change of bias compensation for V7 for an average collector current, after filtering the video information, ranging from 1.75 A to 4.5 A. The quiescent collector current with no signal input is approximately 400 mA.

Under high power (black level) conditions, V2 acts to shorten the time constant, and below 1.75 A, emitter followers V3/V4 saturate and provide an "end-stop" to the action of the circuit.

Modification of these component values would be needed for other transistors with different internal thermal characteristics.

The bias compensation voltage for the RF driver amplifier is fed to the bias circuit of the driver amplifier via terminals B, and in parallel to the bias circuits of a number of other RF amplifier stages of the transmitter, all of which employ the same transistor type as V7 of the RF driver amplifier illustrated in FIG. 5A.

Various modifications of the above-described and illustrated arrangements are possible within the scope of the invention.

For example although the invention has been described with reference to television transmitting equipment in which compensation is provided for internal temperature changes within an amplifying transistor due to RF power levels varying with the degree of modulation of the signal, the invention may be applied in other applications where changing RF power levels produce changing internal temperature and corresponding changes of conduction point, Vbe.

Also although the invention has been described with specific reference to a transistor as the amplifying device, it may also be applied to thermionic devices such as amplifying tubes, to correct for similar internal thermal effects due to changing levels of RF power.

The compensation signal may be derived other than from the main current path of the semi-conductor device to which the correction is applied, provided it is derived from a signal which is directly related to the radio frequency signal giving rise to the heating effect within the device, for example from the RF power output stage of the signal chain in which the radio-frequency amplifier is incorporated, or from a video signal amplifier or modulator stage prior to the radio-frequency amplifier.

We claim:

1. A radio-frequency amplifier incorporating at least one amplifying device having an input bias circuit and an output circuit comprising means for continuously applying to the input bias circuit of the device a compensation signal having a magnitude continuously related to changes in the radio frequency power handled by the device to compensate for changes in the conduction point of the device due to temperature changes within the device resulting from changes in the radio frequency power handled by the device in which the compensation signal related to the changes in the radio frequency power handled by the device is derived from a sensing element in the output circuit of the device.

2. An amplifier in accordance with claim 1 in which the sensing element is connected in the principal current path of the device.

3. An amplifier in accordance with claim 2 in which the sensing element is a resistor.

4. A radio-frequency amplifier incorporating at least one amplifying device having an input bias circuit comprising means for continuously applying to the input bias circuit of the device a compensation signal having a magnitude continuously related to changes in the radio-frequency power handled by the device to compensate for changes in the conduction point; of the device due to temperature changes within the device resulting from changes in the radio-frequency power handled by the device, the compensation signal being derived from a sensing element in the circuit of the device, and in which the compensation signal is derived from elsewhere in a signal chain of which the amplifier forms a part.

5. An amplifier in accordance with claim 4 in which the compensation signal is derived from a point in the signal chain following the amplifier.

6. A radio-frequency amplifier incorporating at least one amplifying device, comprising means for applying to the device a compensation signal related to changes in the radio-frequency power handled by the device to compensate for changes in the conduction point of the device due to temperature changes within the device resulting from changes in the radio frequency power handled by the device, in which the compensation signal is applied to a biasing circuit of the device, and wherein the compensation signal is applied to the biasing circuit of the device by means of a signal filter the time constant of which is related to the internal thermal time constant of the device due to changes of power level therein.

7. An amplifier in accordance with claim 6 in which the time constant of the signal filter is substantially the same as the internal thermal time constant of the device.

8. An amplifier in accordance with claim 2 in which the device is a semi-conductor device.

* * * * *